United States Patent
Kasahara

[11] Patent Number: 6,008,527
[45] Date of Patent: Dec. 28, 1999

[54] DIODE DEVICE

[75] Inventor: Takeshi Kasahara, Tsurugashima, Japan

[73] Assignee: Toko Kabushiki Kaisha, Tokyo, Japan

[21] Appl. No.: 09/042,026

[22] Filed: Mar. 13, 1998

[30] Foreign Application Priority Data

Mar. 14, 1997 [JP] Japan .................................. 9-079112

[51] Int. Cl.⁶ .................................................. H01L 31/075
[52] U.S. Cl. ........................................... 257/656; 257/778
[58] Field of Search .................................. 257/777, 778, 257/603–606, 481, 656

[56] References Cited

U.S. PATENT DOCUMENTS

| | | | |
|---|---|---|---|
| 3,821,779 | 6/1974 | Usuda | 257/656 |
| 4,250,520 | 2/1981 | Denlinger | 257/778 |
| 4,608,589 | 8/1986 | Goth et al. | 257/516 |
| 4,860,083 | 8/1989 | Kojo | 257/516 |
| 4,999,683 | 3/1991 | Kiyomura et al. | 257/606 |
| 5,181,083 | 1/1993 | Pezzani | 257/656 |

Primary Examiner—David B. Hardy
Attorney, Agent, or Firm—Pillsbury Madison & Sutro Intellectual Property Group

[57] ABSTRACT

A diode device for face down bonding use comprising: a semiconductor main body; a first region for forming an electrode, the region being exposed at a first surface of the semiconductor main body; a first electrode provided in the first region; a second region for forming another electrode, the second region being provided within the semiconductor main body; a third region conducting the second region to the first surface through the semiconductor main body; and a second electrode provided in the third region on the first surface.

1 Claim, 2 Drawing Sheets

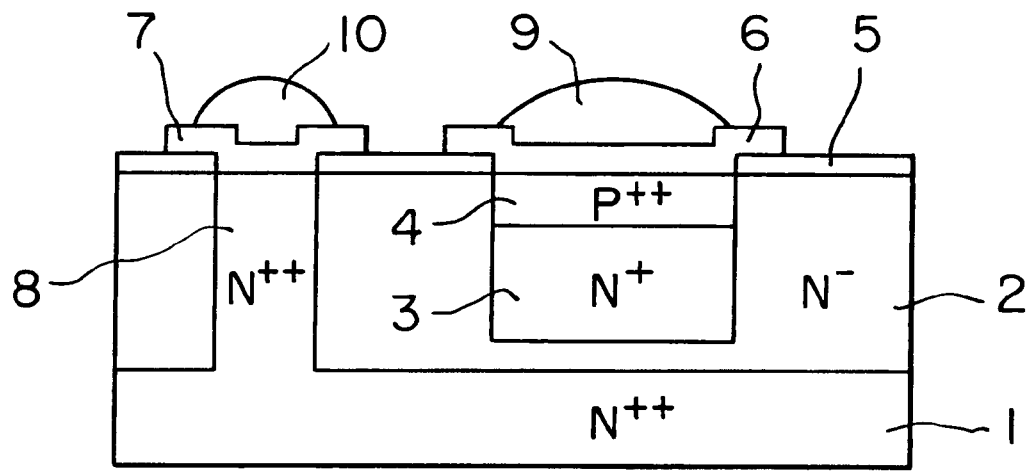
F I G. 1
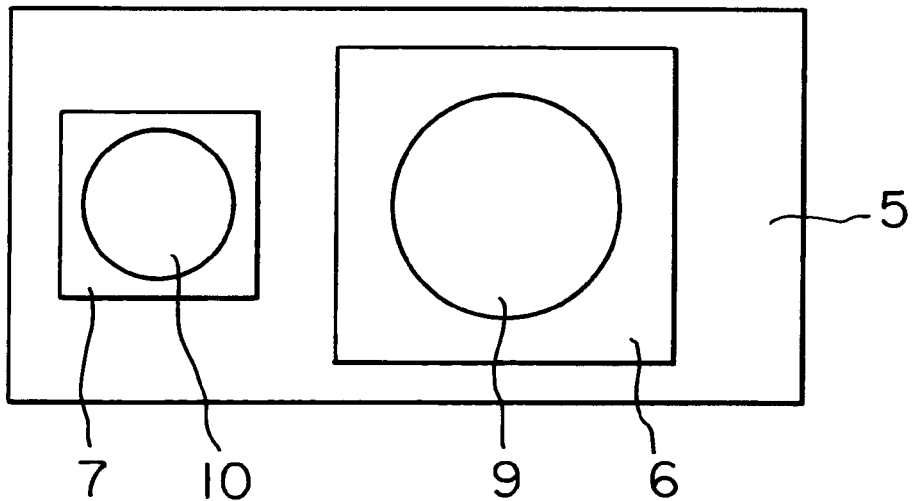
F I G. 2

DIODE DEVICE

BACKGROUND OF THE INVENTION

1. FIELD OF THE INVENTION

The present invention relates to a diode device, having both electrodes provided on a same surface thereof, capable of being directly connected to a conductive pattern on a circuit board without using lead wires.

2. DESCRIPTION OF THE RELATED ARTS

Face-down bonding is a method for directly attaching integrated circuits to circuit boards such as printed boards and the like without using lead wires, conventionally used in the construction of various types of electronic circuits.

According to this method, electrodes are provided on the same surface of the integrated circuit, which is then turned face down and bonded directly to the circuit board. Since the integrated circuit consequently requires no packaging, the size of the integrated circuit can be scaled-down, lowering costs. For these reasons, face-down bonding is widely used.

However, although this method can be used for integrated circuits, chiefly being provided transistors in it, in which electrodes can be disposed on the same surface, it has not been possible to use face-down bonding in the case of diode devices having only two electrodes, such as, for instance, variable-capacity diodes.

FIG. 4 is a cross-sectional view illustrating a conventional variable-capacity diode device, in which region 3 and region 4, having different conductive types, are provided within an epitaxial layer 2 on a silicon semiconductor substrate 1, thereby forming a PN junction such as super abrupt junction.

In FIGS. 4, 5 is an insulating film comprising silicon oxide, 6 is an electrode connecting to region 4, 15 is a lead wire, 16 and 17 are board-shaped terminals formed from lead frames.

Region 4 is exposed on the surface of the semiconductor main body which comprises the substrate 1 and the epitaxial layer 2, enabling an electrode to be provided on the surface of region 4. But, since region 3 lies beneath region 4, an electrode 18, which connects to region 3, is provided on the underside of the substrate 1.

The underside electrode 18 is securely joined to the terminal 16, by inserting a gold ribbon into the joint interface between the substrate 1 and the terminal 16 and applying heat thereto, a eutectic bond are formed of the terminal 16, the gold and the substrate 1.

The surface electrode 6 is connected to the terminal 17 by a gold lead wire 15.

The terminals 16 and 17 only are exposed to the outside, and packaging, such as a resin sealant, is provided. The terminals 16 and 17 are then connected to a circuit board.

Thus it has not been possible to connect the conventional diode device to a circuit board by means of face-down bonding since the two electrodes cannot be provided on the same surface.

SUMMARY OF THE INVENTION

The present invention aims to provide a diode device, having both electrodes provided on the same surface thereof, which can be face-down bonded to a circuit board.

In order to achieve the above objective, the diode device of the present invention comprises: a first region, provided with a semiconductor main body and exposed at a surface thereof; second or fifth region for forming a junction to create a diode with said first region, said second or fifth regions being provided below said first region; a third region, said third region being provided below said second or fifth region; a fourth region of the same conductivity type as said third region, said fourth region being exposed at a surface of said main body and extending vertically to said third region; a first electrode, said first electrode being provided on a surface of said main body and connecting to said first region; and a second electrode, said second electrode connecting to said fourth region.

Since a region at one end of the diode to form the diode junction is provided within the semiconductor main body, it is not possible to connect an electrode to this region at the surface of this region. Therefore, another region, which has the same conductivity type as the region provided within the semiconductor main body, is exposed at the surface, so as to enable the electrode to be connected at the surface via this other region.

BRIEF DESCRIPTION OF THE DRAWINGS

In the drawings:

FIG. 1 is a cross-sectional view of a diode device according to an embodiment of the present invention;

FIG. 2 is a front view of FIG. 1;

DETAILED DESCRIPTION OF THE PREFERRED EMBODIMENTS

Figure 4:
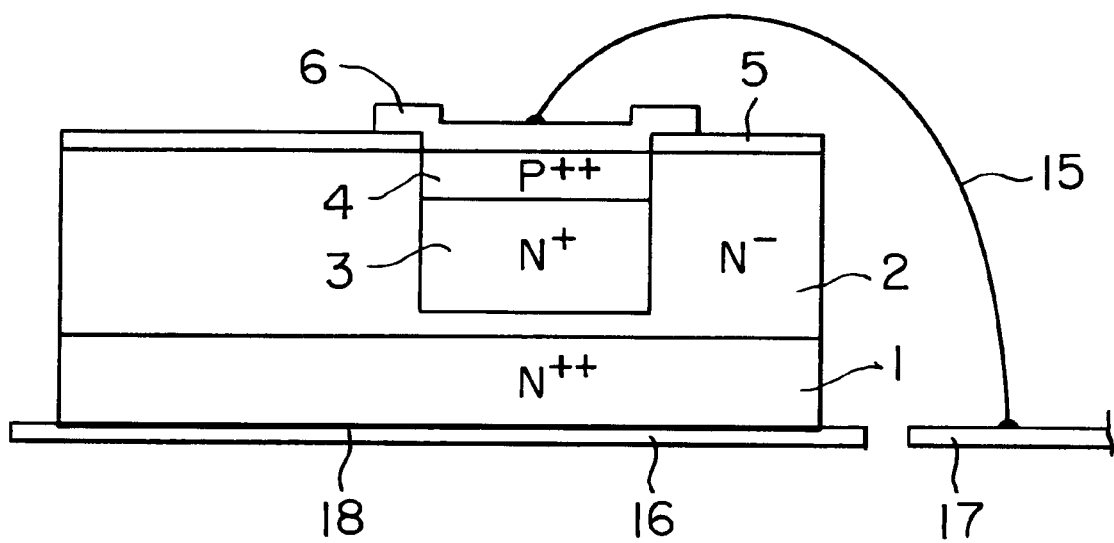
FIG. 4 is a cross-sectional view illustrating a conventional variable-capacity diode device.

There will be detailed below the preferred embodiments of the present invention, based on an example of a variable-capacity diode device, with reference to FIG. 1 and FIG. 2. FIG. 1 shows a cross-sectional view, and FIG. 2, a front view. Like members for those in FIG. 4 are designated by like reference characters.

In FIG. 1, a high resistivity epitaxial layer 2 is provided on a low resistivity silicon semiconductor substrate 1. The epitaxial layer 2 and the substrate 1 each have N-type conductivity.

A low resistivity first region 4, having P-type conductivity, is provided in the epitaxial layer 2 so as to be exposed at the surface thereof. A low resistivity second region 3, having N-type conductivity, is provided below the first region 4 in the epitaxial layer 2. Region 4 and region 3 form a PN junction.

Furthermore, a low resistivity fourth region 8, having N-type conductivity, is provided in the epitaxial layer 2 at a position separated from the regions 3 and 4, extending from the surface of the epitaxial layer 2 to the substrate 1.

A first electrode 6 and a second electrode 7 are respectively connected to the region 4 and the region 8 on the surface of the epitaxial layer 2.

Furthermore, A bump 9 and a bump 10, which are required for performing, face-down bonding, are provided respectively on the electrode 6 and the electrode 7.

In the above variable-capacity diode device, the electrode 6, being the anode, connects directly to the region 4; and the electrode 7, being the cathode, connects to region 3 through the region 8, the substrate 1 (which here functions as a third region) and the thin section of the N-type epitaxial layer 2.

In this case, face-down bonding can be performed since both the electrodes 6 and 7 are provided on the same surface of the epitaxial layer 2 of the semiconductor main body.

This type of variable-capacity diode device can be manufactured by a method in which the region 8 is first formed in the epitaxial layer 2, according to a conventional manufacturing method of a variable-capacity diode device.

Figure 3:
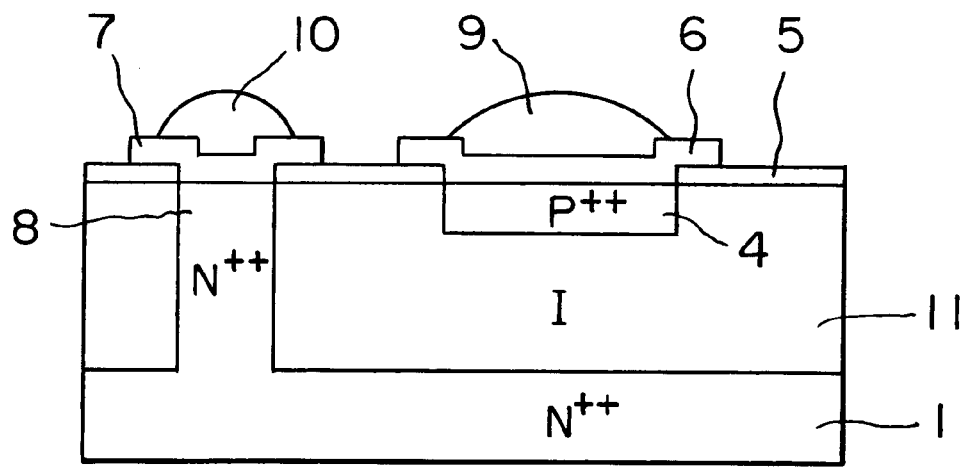
FIG. 3 is a cross-sectional view of a diode device according to another embodiment of the present invention.

FIG. 3 shows a cross-sectional view of another embodiment of the diode device of the present invention, comprising a PIN diode device.

As FIG. 3 shows, an approximately intrinsic semiconductor (indicated by symbol I) epitaxial layer 11, having extremely high resistivity, is provided on a semiconductor substrate 1. A P-type region 4 is provided in the epitaxial layer 11, exposed at the surface thereof.

In other words, the intrinsic semiconductor epitaxial layer 11 is inserted between the N-type substrate 1 and the P-type region 4, so that NI and PI junctions are formed between the substrate 1 and the epitaxial layer 11 and between the region 4 and the epitaxial layer 11 respectively, thereby forming a PIN diode device.

A region 8, which is provided in the epitaxial layer 11, extends from the surface of the epitaxial layer 11 to the substrate 1. Furthermore, an electrode 7 is connected to the region 8.

The electrode 7 connects to the substrate 1 through the region 8 which functions as a third region.

In the present embodiment, the substrate 1, functioning as a third region, forms a NI junction which comprises one end region of the diode. This end region connects to the electrode 7 through the region 8, which has the same type of conductivity.

In the first embodiment, the substrate 1 was not an end region of the diode providing a PN junction, but merely functioned in collaboration with region 8 in order to connect region 3, comprising one end of the diode and providing a PN junction, to the electrode 7.

The third region may form a junction and thereby create a diode, or alternatively, the third region may simply function as a conductor and not create a diode.

Furthermore, in the above example, the substrate 1 functioned as the third region, but it is also possible to provide a buried layer, separate from the substrate 1, and to use this buried layer as the third region.

In the present embodiment, the region 8 was provided in one position near to the region 4, which formed a diode junction and was exposed on the surface, but the region 8 may alternatively be provided in a circular shape around the region 4.

Moreover, the above embodiments illustrated the examples of a variable-capacity diode device and a PIN diode device, but the present invention can be used in a wide variety of diode devices.

As explained above, the diode device of the present invention comprises a region, which is not exposed on the surface, connected to another region, which is exposed on the surface, the unexposed region being connected to an electrode on the surface via the exposed region.

Therefore, the electrodes can be provided on the same surface, so as to enable the device to be connected to a circuit board without the use of a lead wire.

Thus, the diode device of the present invention can be connected to a circuit board in the same way as an integrated circuit being provided transistors. Consequently the present invention offers the extremely practical advantages of being small-scale and cost-efficient.

While there have been described what are at present considered to be preferred embodiments of the invention, it will be understood that various modifications may be made thereto, and it is intended that the appended claims cover all such modifications as fall within the true spirit and scope of the invention.

What is claimed is:

1. A diode device for face-down bonding use comprising:

a semiconductor main body;

a first region of one conductivity type, said first region being provided within an epitaxial layer in the semiconductor main body and exposed at a surface thereof;

a second region of an opposite conductivity type of said first region for forming a junction with said first region, said second region being provided below said first region and within the semiconductor main body;

a third region of the same conductivity type as said second region, said third region being provided below said second region and comprising a semiconductor substrate;

a fourth region of the same conductivity type as said second region, said fourth region being provided within an epitaxial layer in the semiconductor main body, being exposed at a surface of said main body and extending vertically to said third region;

a first electrode, said first electrode being provided on a surface of said main body and connecting to said first region; and a second electrode connected to said fourth region.

* * * * *